United States Patent
Wu et al.

(10) Patent No.: US 9,871,151 B2
(45) Date of Patent: Jan. 16, 2018

(54) PHOTOVOLTAIC CELL WITH WRAP THROUGH CONNECTIONS

(75) Inventors: Yu Wu, Petten (NL); Lambert Johan Geerligs, Petten (NL); Johannes Adrianus Maria van Roosmalen, Petten (NL); Yuji Komatsu, Petten (NL); Nicolas Guillevin, Petten (NL)

(73) Assignee: STICHTING ENERGIEONDERZOEK CENTRUM NEDERLAND, Petten (NL)

( * ) Notice: Subject to any disclaimer, the term of this patent is extended or adjusted under 35 U.S.C. 154(b) by 374 days.

(21) Appl. No.: 14/130,383

(22) PCT Filed: Jul. 2, 2012

(86) PCT No.: PCT/NL2012/050467
§ 371 (c)(1),
(2), (4) Date: Mar. 12, 2014

(87) PCT Pub. No.: WO2013/006048
PCT Pub. Date: Jan. 10, 2013

(65) Prior Publication Data
US 2014/0174525 A1 Jun. 26, 2014

(30) Foreign Application Priority Data
Jul. 1, 2011 (NL) ..................... 1038916

(51) Int. Cl.
*H01L 31/00* (2006.01)
*H01L 31/0224* (2006.01)
*H01L 31/068* (2012.01)

(52) U.S. Cl.
CPC .......... *H01L 31/02245* (2013.01); *H01L 31/022441* (2013.01); *H01L 31/022458* (2013.01);
(Continued)

(58) Field of Classification Search
CPC ....... H01L 31/022441; H01L 31/02245; H01L 31/022458; Y02E 10/50; Y02E 10/548
(Continued)

(56) References Cited

U.S. PATENT DOCUMENTS

2007/0023082 A1* 2/2007 Manivannan ....... H01L 31/0747 136/258
2008/0174028 A1* 7/2008 Korevaar .......... H01L 31/02242 257/774
(Continued)

FOREIGN PATENT DOCUMENTS

EP 1950810 7/2008
JP 2008-3004401 A 11/2008
(Continued)

OTHER PUBLICATIONS

Clement, Florian et al; Pilot-Line Processing of Screen-Printed CZ-SI MWT Solar Cells Exceeding 17% Efficiency; Photovoltaic Specialists Conference, 2009 34th IEEE, Jun. 7, 2009, pp. 223-227.
(Continued)

*Primary Examiner* — Lindsey Bernier
(74) *Attorney, Agent, or Firm* — Jackson Walker LLP

(57) ABSTRACT

Known photovoltaic cells with wrap through connections have output terminals of both polarities on its back surface, one of which is coupled to the front surface via the wrap through connections. The invented solar cell is manufactured by creating an emitter layer on the back surface. Electrode material is applied in mutually separate first and second areas on the back surface. The electrode material in the first area contacts the emitter. The second area covers a surrounding of a hole that provides for the connection on the back surface. The electrode material in the second area lies on the emitter and around the second area the emitter is interrupted by a trench. On the front surface a further area of electrode material is applied over the hole. If necessary
(Continued)

the electrode material in the second area on the back surface is applied on a supporting surface that is substantially electrically isolated from current flowing laterally through the emitter layer underneath the first area.

12 Claims, 7 Drawing Sheets

(52) U.S. Cl.
CPC .......... *H01L 31/0682* (2013.01); *Y02E 10/50* (2013.01); *Y02E 10/547* (2013.01); *Y02E 10/548* (2013.01)

(58) Field of Classification Search
USPC .................. 136/252, 255, 256, 258, 261
See application file for complete search history.

(56) References Cited

U.S. PATENT DOCUMENTS

| | | | |
|---|---|---|---|
| 2010/0147378 A1* | 6/2010 | Lee | H01L 31/1804 136/256 |
| 2010/0218818 A1* | 9/2010 | Kang | H01L 31/02168 136/256 |
| 2011/0253211 A1* | 10/2011 | Krokoszinski | H01L 31/02167 136/256 |
| 2011/0284051 A1 | 11/2011 | Miyauchi | |
| 2012/0152348 A1* | 6/2012 | Miura | H01L 31/02242 136/256 |
| 2012/0167980 A1* | 7/2012 | Engelhart | H01L 31/02242 136/256 |

FOREIGN PATENT DOCUMENTS

| | | | |
|---|---|---|---|
| WO | 2010/049268 | 5/2010 | |
| WO | WO 2011029640 A2 * | 3/2011 | ..... H01L 31/022425 |
| WO | WO 2011037261 A1 * | 3/2011 | ..... H01L 31/022425 |
| WO | 2011040489 A1 | 4/2011 | |
| WO | 2011129368 A1 | 10/2011 | |

OTHER PUBLICATIONS

A Notice of Reasons for Rejection dated Mar. 29, 2016 by Japanese Patent Office for corresponding Japanese patent application No. 2014-518847 with English translation.

A Notice of Reasons for Rejection dated Nov. 8, 2016 by Japanese Patent Office for the corresponding Japanese patent application No. 2014-518847 in English language.

\* cited by examiner

PHOTOVOLTAIC CELL WITH WRAP THROUGH CONNECTIONS

FIELD OF THE INVENTION

The invention relates to a photovoltaic cell (e.g. a solar cell) and a method of manufacturing such a photovoltaic cell.

BACKGROUND

Known photovoltaic cells comprise a semi-conductor body wherein light excites free charge carriers, which give rise to an output voltage and current between and through output terminals of the cell. The semi-conductor body is a thin flat sheet, with a large diameter and a much smaller thickness between its front and back surface. Electrodes distributed over substantially the entire front and back surface provide low resistance connections to the terminals. In many photovoltaic cells, the terminals are also provided on the front and back surface, together with the electrodes to which they are connected. However, it is also known to provide the terminals both on the same surface, typically on the back surface, that is, the surface that is turned away from the sun (or other light source) during use. Terminals on the same surface are made possible by a metal wrap through connection (MWT) in the form of a hole (also called via) filled with conductor material that runs from one surface to another.

The use of MWT connections has the problem that it can give rise to short circuits that may lead to loss of output current through the terminals or even damage. Since MWT connections were first proposed for photovoltaic cells, this problem has resulted in many proposals for avoiding short circuits. In spite of the long felt need for a solution to the short circuit problems of MWT in photovoltaic cells, the solutions are still quite complex in terms of additional processing and required accuracy.

A process of manufacturing photovoltaic cells with MWT connections is known from an article by Florian Clement et al, titled "Pilot Line processing of screen printed cs-Si MWT solar cells exceeding 17% efficiency", published in the 34th IEEE PV Specialists conference, Philadelphia, 2009 pages 223-227. In this process, the starting point is a semiconductor substrate with vias through the substrate. A junction is realized by doping the surface. On the back surface, a back surface field layer (BSF) is created to provide contact to and passivation of the bulk. P contacts are also printed onto the back surface, which serve to realize one of the terminals of the cell. Conductor paste is printed on the front surface of the cell in the form of an electrode grid pattern that runs over the via. In order to provide a connection from the other terminal to the front, an area of conductor paste is first printed on the back surface at and around the location of the via and into the via. The conductor pastes are heated in a firing step, whereby electrodes are formed. The cell's output voltage can be coupled out from the back surface, between the P contacts and fired conductor paste.

Like all processes of manufacturing photovoltaic cells with MWT technology, this process requires additional measures to prevent short circuit problems involved with the via. Possible short circuit problems in this cell may involve unintended current paths in the wall of the via and currents due to local flaws in the emitter layer and alignment of cell features.

The process by Clement et al. addresses these problems by providing an emitter layer in the via, and locally on the rear in an area incorporating the location of the via and front contact, combined with cutting trenches in the front and back surface, for example by laser cutting. A trench is provided on the front surface near the edge of the cell to prevent current from the front surface around the edge. Furthermore, trenches are cut on the back surface in the local emitter area, encircling the areas of conductor paste on the back that are in contact with the vias. When the area of conductor paste is accurately aligned and trenches are properly positioned to separate the areas of (front-contacting) conductor paste from the BSF, this prevents a short circuit. The requirement of reliable application of the emitter layer on the wall of the hole limits the choice of available processes for applying the emitter. Due to process limitations complex measures are needed to apply this technique to n-type semi-conductor bodies.

US 2007/0023082 and EP1950810 describe a similar cell wherein a graded p-type emitter layer on the front surface of the n-type substrate is covered by a conducting coating that is electrically connected to a first electrode on the back surface through a via. On the back surface a graded n-type layer is used as a back surface field in contact with a second electrode, and a layer with an intrinsic-to-p-type grading is provided in an area incorporating the via. A trench separates the graded n-type layer from the layer with intrinsic-to-p-type grading and thus the parts of the back surface that are in contact with the first and second electrode. In another embodiment, the graded n-type layer may be selectively removed from the area incorporating the via, or deposited selectively outside that area and the contact electrode to the via is provided on the back surface on a simple intrinsic amorphous silicon layer.

In these embodiments the via contains a conductor which is electrically connected to the emitter, and because the via wall is not passivated or isolated, the emitter contact is therefore in direct contact with base material, a configuration which increases the risk of shunt or reverse current problems. US 2007/0023082 also mentions the possibility of first removing the graded n-type layer over the entire part of the back surface that is in contact with the first electrode. This reduces leakage, but it makes the manufacturing process more complex.

SUMMARY

Among others, it is an object to provide for a photovoltaic cell with conductive wrap through connections wherein short circuit currents can be reduced in a more simple way.

According to one aspect a method of manufacturing a photovoltaic cell is provided, wherein the method comprises
  providing a semiconductor body of a first conductivity type having a front surface and a back surface, with at least one hole through the semiconductor body from the front surface to the back surface,
  creating a layer of a second conductivity type at least adjacent the back surface in or on the semiconductor body;
  applying electrode material in mutually separate first and second areas on the back surface, the electrode material in the first area electrically contacting the layer of the second conductivity type outside the second area, the second area of electrode material covering the hole on the back surface, the electrode material in the second area being applied on the layer of the second conductivity type;
  creating an at least partial interruption of the layer of the second conductivity type around the second area;

applying electrode material in a further area of on the front surface, the electrode material of the further area covering the hole on the front surface in electrical contact with the electrode material in the second area on the back surface.

A conductor wrap through cell is made wherein the emitter is provided on the back surface, that is, on the surface of the cell on which both contact electrodes are provided. Compared to a cell with a front side emitter, this reduces the risk that short circuits through the substrate arise if the inside wall of the via or the rear surface under the emitter contact is not fully covered with an emitter layer, has no insulation, or the metal contact in the via is overfired.

The electrode material is applied in the second area on the layer of the second conductivity type as a supporting surface, the supporting surface being substantially electrically isolated from current flowing laterally through the layer of the second conductivity type at positions corresponding to an edge of the first area. Lateral current is current parallel to the surface, for example current within the layer of the second conductivity type, as far as it reaches in the direction of the second area. In this way short circuit current on the back surface is reduced.

The substantial electrical isolation from lateral current from the layer of the second conductivity type is realized by at least partial interruption of the layer in the lateral direction around the support surface, in which case the support surface may be the surface of the layer of the second conductivity type. Alternatively, substantial electrical isolation may be realized by removing the layer of the second conductivity type at least partly at all locations covered by the entire second area, or by not or only partly depositing the layer of the second conductivity type there. In this case the semiconductor body may provided the support surface. In another embodiment the substantial isolation may be realized with an isolation layer provided in the second area, the top of which provides the support surface. Interruption of the layer may be realized by cutting a trench, or not depositing the layer in a contour around the second area.

Application of the electrode material is applied in the second area on the layer of the second conductivity type with an interruption around it simplifies manufacture, because there is no need to provide that the second area is free of the layer of the second conductivity type, which may require additional process steps or accurate patterning. When the layer of the second conductivity type is part of a heterojunction for example, providing that the second area free of the layer of the second conductivity type can significantly complicate the process. Of course the requirement that electrode material is applied in the second area on the layer of the second conductivity type does not exclude that the electrode material in the second area may also be present at locations where, locally, there is no layer of the second conductivity type, for example due to process damage etc.

Preferably, the layer of the second conductivity type (forming an emitter) extends over substantially the whole back surface. The hole may be formed before or after the formation of the layer of the second conductivity type.

In an embodiment a layer of increased conductivity of the same conductivity type as the semiconductor body may be created at the front surface. This layer may serve as a front surface field that improves electrical contact with the area of conductor material at the hole. In a further embodiment this layer may extend along the wall of the hole. Because the emitter is at the back, this does not lead to short circuit problems. This simplifies the process and provides for reduced output impedance of the cell.

In an embodiment, the same metal material can be used to form contacts in the via and emitter back surface electrode structure without significant short circuits, even if one step is used to form the via contact, the rear emitter grid and the connection to the front surface.

Use of the via may make a front surface field superfluous (as is known per se, a front surface field is an area with the same conductivity type as the substrate, but with increased doping of that conductivity type to enhance passivation and/or contact to the electrode material). In an embodiment a front surface field is omitted. This improves optical transmission.

In an embodiment the first and second areas of electrode material are applied on the back surface by printing a paste comprising the electrode material. This provides for a simple manufacturing and low manufacturing cost. The paste may subsequently be fired (heated) to reduce electrical resistance. In an embodiment the further area of electrode material on the front surface is also printed. Both front and back surface pastes may be fired together without risk of short circuit. Other techniques for depositing electrode material can be used such as inkjet printing, sputtering, etc. Blanket (continuous) electrode materials can be used.

According to another aspect a photovoltaic cell is provided, comprising a semiconductor body of a first conductivity type having a front surface and a back surface, with at least one hole through the semiconductor body from the front surface to the back surface, a layer of a second conductivity type at least adjacent the back surface in or on the semiconductor body;

electrode material in mutually separate first and second areas of on the back surface, the electrode material in the first area electrically contacting the layer of the second conductivity type outside said second area, the second area covering the hole on the back surface, the electrode material in the second area lying on the layer of the second conductivity type, the layer of the second conductivity type around the second area being at least partially interrupted;

electrode material in a further area on the front surface, the further area covering the hole on the front surface in electrical contact with the electrode material of the second area on the back surface.

BRIEF DESCRIPTION OF THE DRAWING

These and other objects and advantageous aspects will become apparent from a description of exemplary embodiments, using the following figures.

DETAILED DESCRIPTION OF EXEMPLARY EMBODIMENTS

Figure 1:
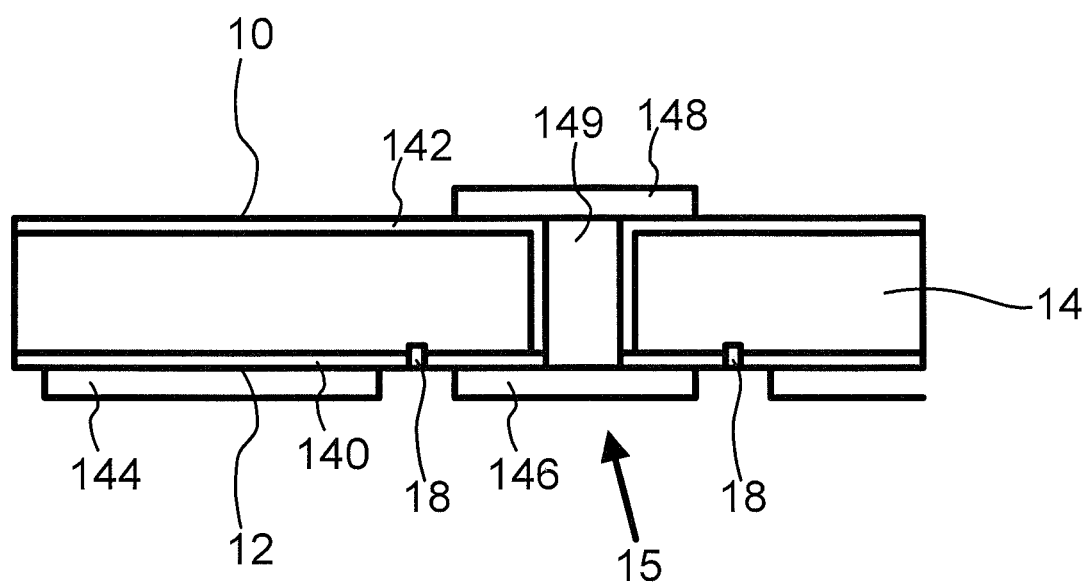
FIG. 1 shows a cross-section through the thickness of part of a photovoltaic cell

FIG. 1 schematically shows a cross-section through the thickness of part of a photovoltaic cell, from a front surface 10 to a back surface 12. As will be understood, the front and back surface in the cell extend in two dimensions over well beyond the part shown, each surface having a length and width or more generally a diameter that is much larger than the thickness. Hence the edges of the cell are not shown in the figure.

The photovoltaic cell comprises a semi-conductor body 14 of a first conductivity type, with vias 15 (only one shown) through the body from front surface 10 to the back surface 12. An emitter layer 140 is provided in or on semiconductor body 14 at the back surface 12, in emitter layer 140 semiconductor body 14 is doped with a doping of a second conductivity type, opposite to the first conductivity type in semiconductor body 14. In one example, the first and second conductivity type may be n-type and p-type respectively.

On the front surface and optionally at least partly in the wall of via 15, a front surface field layer 142 is provided on or in semiconductor body 14. A first pattern 144 of conductive material (e.g. metal) is provided on the back surface 12 over a part of emitter layer 140. Furthermore, an island 146 of conductive material is provided on back surface 12 over via 15 (only one island is shown, but it should be appreciated that more than one island may be provided on back surface 12, for example on different vias). A second pattern 148 of conductive material is provided on the front surface 10 over front surface field 142 and over via 15. Via 15 contains conductor material 149 electrically connecting island 146 and second pattern 148. A first terminal (not shown) of the photovoltaic cell is coupled to first pattern 144 of conductive material and a second terminal (not shown) is connected to island 146. The terminals (not shown) may lie on top of first pattern 144 and island 146 or they may lie elsewhere, an interconnection (not shown) being provided between the terminals and first pattern 144 and island 146 respectively.

A trench 18 through emitter layer 140 is provided in back surface 12 between island 146 and first pattern 144 of conductive material, in a closed contour around island 146. If there is more than one island on back surface 12, a plurality of such trenches may be provided, each in a closed contour around a respective different island 146. Further details of the cell have been left out. For example texture, a transparent coating, interconnecting electrodes and additional layers may be provided.

In operation the output voltage of the cell is supplied from the cell between the terminals (not shown) connected to first pattern 144 and island 146 and the output current of the cell flows through these terminals.

Figure 2:
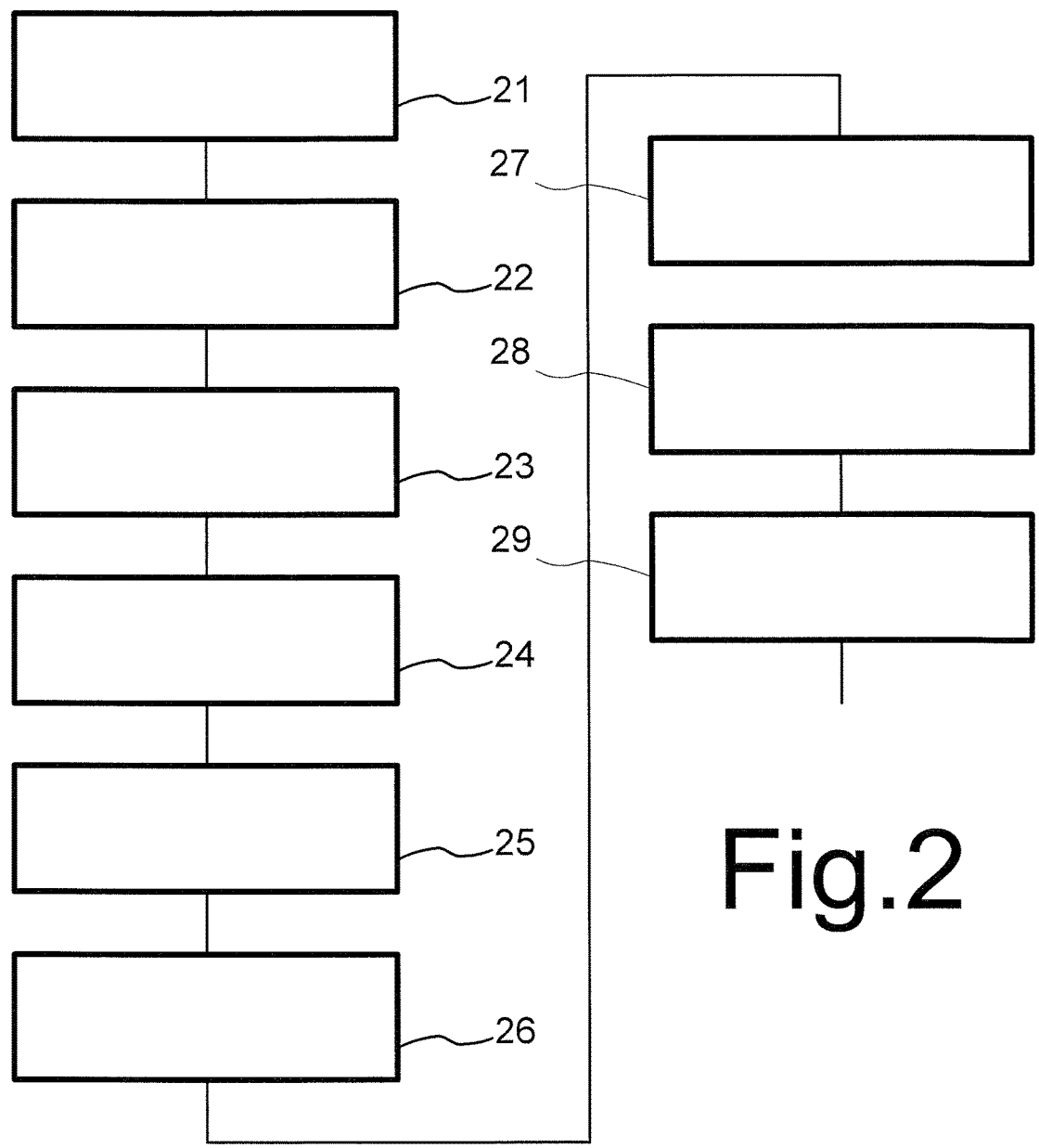
FIG. 2 shows a flow chart of a process of manufacturing the photovoltaic cell
Figure 3:
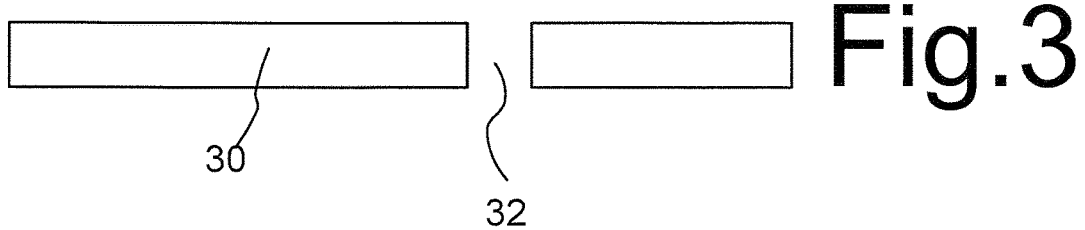
FIGS. 3-8 show cross sections during manufacturing

FIG. 2 shows a flow chart of a process of manufacturing the photovoltaic cell. A number of preparatory steps that result in a substrate of semi-conductor material of a first conductivity type is indicated symbolically by a first step 21. In a second step 22 a hole (also called via) or more generally holes (vias) are made through the substrate, for example by laser drilling, mechanical drilling or etching. This results in a substrate 30 with a hole 32 as shown partly in a cross-section of the photovoltaic cell in FIG. 3 (the diameter and length of hole 32 is not to size and more than one hole (not shown) may be made through substrate 30 at different positions). Substrate 30 may have a thickness in a range of 50-300 micrometer, it may be circular or rectangular or any other shape and it may have a minimum diameter (e.g. length or width) of at least 100 millimeter for example. Hole 32 may have a diameter of 300 micrometer for example. Of course, a narrower or wider hole may be used. Although one hole is shown, it should be appreciated that in an embodiment a plurality of holes may be provided. A hole density in a range of 0.01-1 hole per square centimeter may be used for example, not necessarily uniformly distributed.

Figure 4:
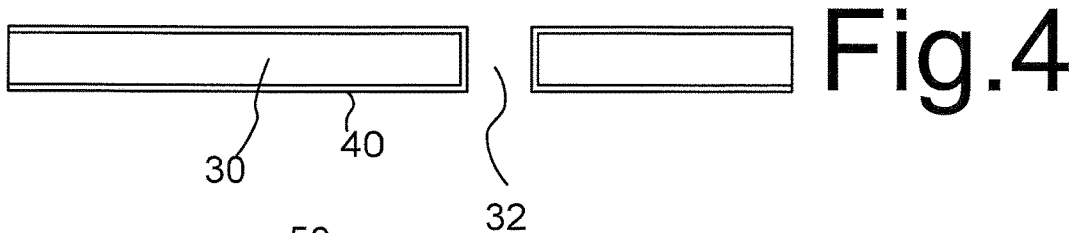

In third step 23 a doped layer of a second conductivity type opposite the first conductivity type is created on the back surface 12. Preferably, the layer extends over the entire back surface, FIG. 4 shows part of substrate 30 with a hole and the doped layer 40 (thicknesses not to scale). By way of example, the result of an embodiment is shown wherein doped layer 40 is initially created on both surfaces. Alternatively, it may be created on the back surface only. As in the case of all figures, only part of the cell is shown, the edges of the cell lying outside the figure. The doped layer 40 may extend over the edges between the front and back surface as well, or into the via. The doping may be independent of lateral position on the back surface. Alternatively, the doped layer 40 (which acts as emitter layer) may be created with variation of the doping as a function of position on the back surface (a so-called selective emitter) to enhance cell efficiency. Methods of creating such emitter layers with lateral doping variation are known per se. The layer may comprise of many closely spaced areas of local doping (a so-called local emitter) which may be interconnected by a metallization pattern.

Any one of a number of processes may be used to create the layer, including processes that add doping to a surface layer of substrate 30 and processes that add the doped layer on substrate 30 (e.g. processes that create a hetero junction). In an embodiment wherein the doped layer is added on substrate 30, third step 23 may comprise deposition of a doped, hydrogen enriched amorphous silicon layer. The doped a-Si:H layer may be deposited using a PECVD process for example (with or without a layer of intrinsic a-Si:H in between the substrate and the doped layer). The type of doping is selected in correspondence with the second conductivity type (e.g. P or B doping). In embodiments wherein a doping is added to a surface layer of substrate 30, third step 23 may comprise diffusion or implantation of doping into substrate 30. A doped silicate glass may be deposited on the surface, followed by a heating step to allow for diffusion of doping from the glass. Heating in an oven or laser heating may be used for example. In another example ion implantation may be used to implant the doping in the surface layer of substrate 30. A process may be used that results in a doped layer at both front and back surfaces, for example a process that comprises immersion in a liquid, or exposure to a gas atmosphere.

Creation of doped layer 40 may be followed at a later stage by creation of a dielectric layer or a transparent conductive oxide (TCO) layer. Such layer may be added for example after all steps that add doping. When doped layer 40 is a heterojunction layer added on substrate 30, a TCO layer may be applied at a later stage for example, the TCO layer may comprise ITO. When doping is added to a surface layer of substrate 30, a dielectric layer may be added, of silicon nitride for example. Such a layer may provide for isolation and passivation of the substrate surface.

In a fourth step 24 a dopant layer of the first conductivity type is created at the front surface of substrate 30 to form a front surface field (FSF). A process that adds doping to a surface layer of substrate 30 may be used, or a process that adds the doped layer on substrate 30. Any of the types of processes described for third step 23 may be used, using a dopant that provides for the first conductivity type. Preferably, the front surface field layer extends over the entire front surface, or at least 90% of the front surface. A layer may be added for example by depositing a doped, hydrogen enriched amorphous silicon layer. The doped a-Si:H layer may be deposited using a PECVD process for example (with or without a layer of intrinsic a-Si:H in between the substrate and the doped layer). The front surface field layer may extend into hole 32 over at least part of the wall of hole 32, or over the entire wall of hole 32. The front surface field may be created with doping independent of lateral position on the front surface. Alternatively, the front surface field may be created with lateral variation of the doping as a function of position on the front surface (a so-called selective front surface field) to enhance cell efficiency. The front surface field layer might also be created in the form of areas of local doping (a local front surface field). The areas may be interconnected by a subsequently applied metallization pattern.

In the case of a heterojunction front surface field, advantageously the TCO can be applied locally and interconnected by subsequent metallization, which avoids the light absorption in TCO on the front in-between the metallized areas. A doped layer may be used only under the front metal grid and not elsewhere on the front surface (with some margin for alignment), enhancing optical transmission.

The use of a back surface emitter makes it possible to apply such position dependent variations on the front surface even if no vias are used to connect the front surface to back side contacts. A TCO may be used that is applied only in selected areas on the front surface. Optionally, doping of the FSF may be varied as a function of position, using higher doping concentrations underneath the areas where the TCO is applied. This increases efficiency.

Figure 5:
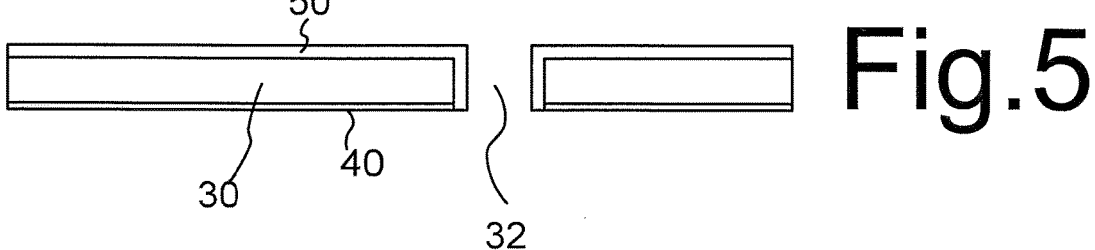

FIG. 5 shows substrate 30 with the front surface field layer 50 (thickness not to scale). Optionally, if the initial doped layer 40 has also been created on the front surface, the initial doped layer 40 may be removed selectively from the front surface (and at the same time from at least part of hole 32), e.g. by a single-side etch, before creation of front surface field layer 50. Fourth step 24 may be followed at a later stage by the application of a transparent conductive oxide layer (TCO), further passivating coatings, dielectric coatings, etc and/or other wet chemistry steps. For the sake of clarity, the resulting layers are omitted from the figures.

In a fifth step 25 conductor material is applied on the back surface. The conductor material may be applied by printing, sputtering or vapor deposition for example.

Figure 6:
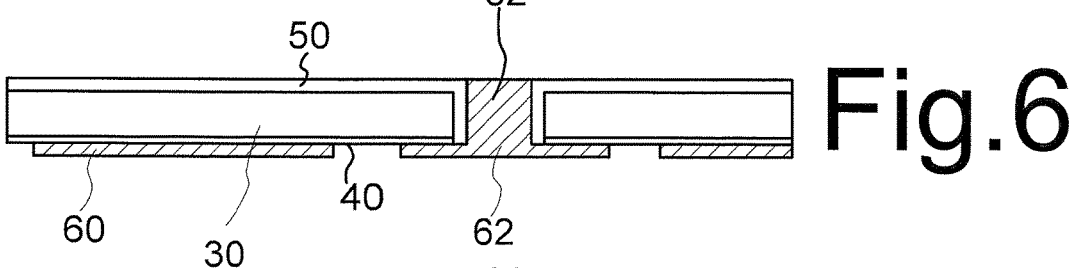

FIG. 6 shows the result of application of conductor material. The conductor material is printed, sputtered or vapor deposited in a two dimensional pattern that contains mutually separate first and second areas 60, 62. Preferably, first area 60 extends over at least 90% of the back surface (if first area 60 is not a continuous conductive film, but e.g. a grid of conductive lines, equivalently preferably first area 60 collects current from an area of the layer of second conductivity type that is at least 90% of the back surface area). A second area 62 is printed over hole 32 and it may extend over a wider area than just the area of the hole. Second area 62 may have a width in a range of 2-3 millimeter for example. A paste comprising conductor material may be used. The thickness of first and second areas 60, 62 may lie in a range of 0.5-60 micrometer for example. The effect of application is that the conducting material will also be present in hole 32 or on the walls of hole 32.

Figure 7:
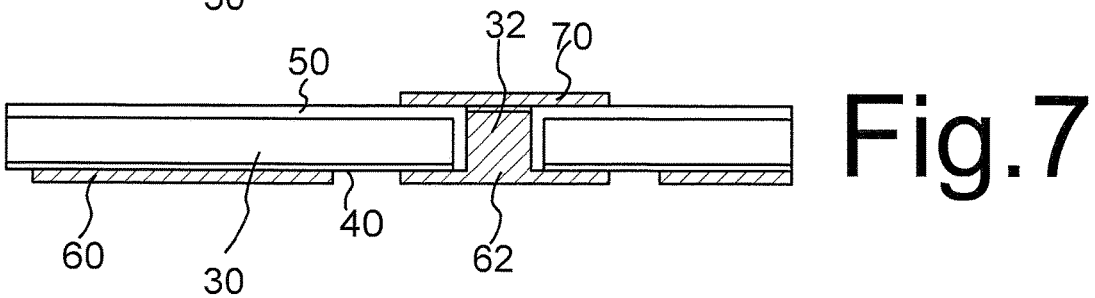

In a sixth step 26 conductor paste is applied on the front surface, for example by printing, sputtering or vapor deposition. FIG. 7 shows the result. The conductor is applied at least as a conductor line 70 that extends over hole 32 in contact with paste in hole 32 that has been printed on the other surface, the conductor line 70 being part of a contact grid, or electrically coupled to a contact grid.

In a seventh step 27 the printed paste is heated. If a dielectric coating has been created on the back surface (e.g. following doping of a surface layer of substrate 30), preferably a fire through step is used wherein conductor material from the applied conductor pattern penetrates the dielectric coating. Firing through may be performed at temperatures above 600 or even 800 centigrade for example. When a TCO layer has been created (e.g. on an added doped layer that forms a heterojunction with substrate 30), a curing step at a lower temperature may suffice. A temperature in a range of 150-200 Centigrade may suffice, at which ohmic contacts are formed.

Figure 8:
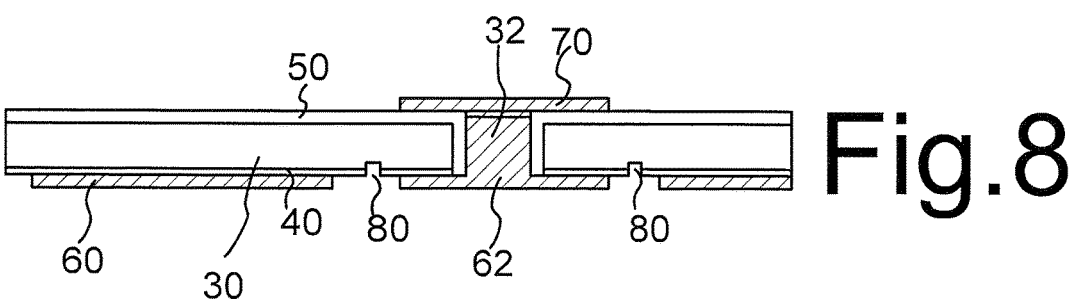

In an eight step 28 a trench is created in a closed contour around the second area 62 on hole 32. The trench reaches to the semi-conductor substrate 30 of the first conductivity type, through the doped layer 40 of the second conductivity type and any other conductive layers on top of it, such as a TCO layer. The trench may be formed by laser cutting or wet chemical etching for example. An additional trench may be formed along the perimeter of the back surface, to prevent conduction along the edges of the cell. FIG. 8 shows the result of seventh step 27 and eight step 28 (as in the case of the other figures, it should be understood that only part of the cell is shown, the edges of the cell lying outside the figure). In the cross section the trench 80 is visible on mutually opposite sides of second area 62. Although eight step 28 is shown after seventh step 27, it should be appreciated that it may be executed earlier, for example before application or heating of the conductor material. This simplifies the process as it avoids the need to create a properly isolating trench through a metal layer. Of course, if the trench is made before application of the conductor material, care should be taking to avoid applying the conductor material extending from one side of the trench to the other.

After eight step 28 various other steps may be performed to finish the cell. These are shown symbolically as a ninth step 29. Conventional steps may be used in ninth step 29. Although an embodiment has been described wherein second step 22 of making the hole is performed at a specific stage of the process, it should be appreciated that the hole may be created at another stage, for example after third step 23 or fourth step 24. Also other steps may be performed in a sequence that differs from the one shown by way of example.

Although an embodiment has been shown that includes application of a front surface field by means of fourth step 24, it should be appreciated that in another embodiment this step may be omitted. Use of a front surface field may reduce cell resistance and improve passivation, but even without a front surface field an operative cell is obtained.

Although in an embodiment doping opposite to the conductivity type of the semiconductor body may be applied on both front and back surfaces, and increased doping of the same conductivity type as the semiconductor body may be applied selectively on the front (and possibly in hole 32) that overcomes the opposite type doping, it will be appreciated that alternatively the opposite conductivity type doping may be applied selectively to the back, or it may be removed selectively from the front. Similarly, the increased doping of the same conductivity type as the semi-conductor substrate could be applied to both front and back, in a concentration that does not completely compensate the doping of the opposite conductivity type on the back surface. In another embodiment the increased doping of the same conductivity type as the semi-conductor substrate may be selectively removed from the back.

Figure 9:
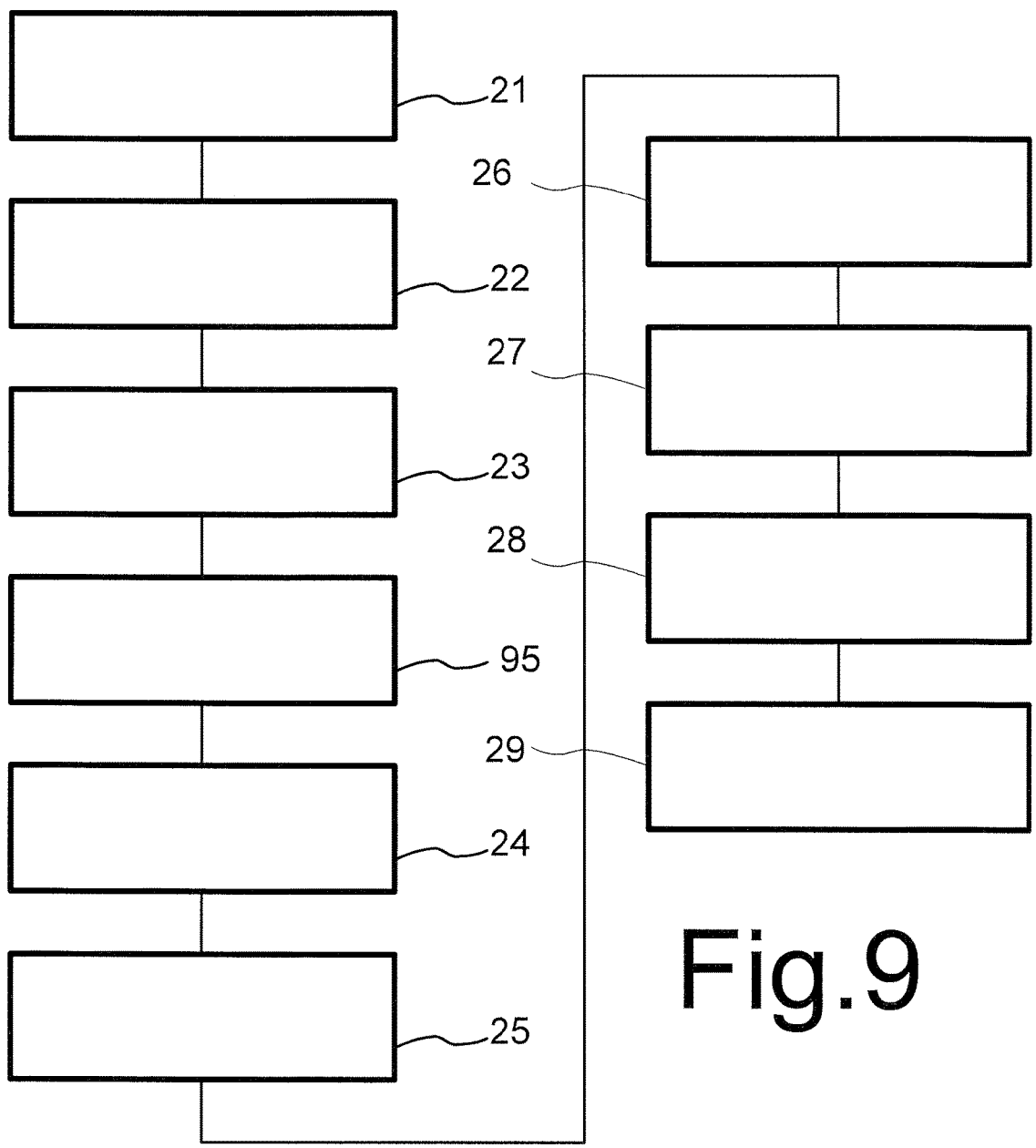
FIG. 9 shows a flow chart of a process of manufacturing the photovoltaic cell
Figure 10:
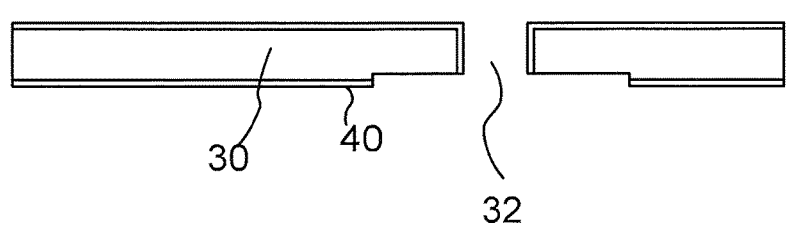
FIGS. 10-11 show cross sections during manufacturing
Figure 11:
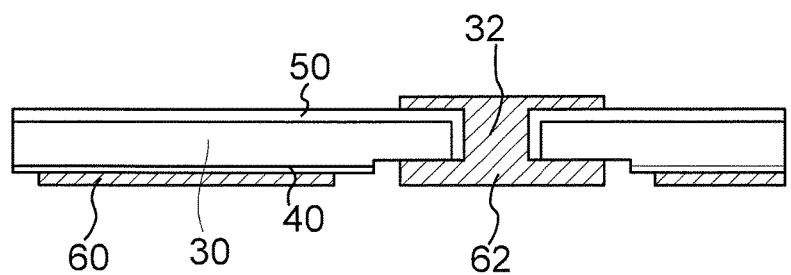

FIG. 9 shows a flow chart of an alternative embodiment of the process. In this process an etching step 95 is performed after third step 23 (for example, but not necessarily, immediately after fourth step 24). FIG. 10 shows a cross-section after etching step 95, wherein part of doped layer 40 has been removed from the back surface 12. In this embodiment eight step 28 may be omitted. More generally etching step 95 may be performed anywhere after third step 23 before application of second area 62 over the hole. Etching step 95 locally removes the doped layer of the second conductivity type where second area 62 will be printed, plus a margin around this second area 62, which fulfills the same role as the trench for isolation. FIG. 11 shows a cross-section after printing the areas of conductor material. Etching may be realized by applying a mask to the back surface that leaves an exposed region wherein second area 62 will be printed and exposing the cell to an etching agent in the exposed regions. Instead of using an etching step 95, material may be locally removed in other ways, for example by laser ablation. Alternatively, the formation of doped layer 40 in or on the back surface 12 may be prevented locally where second area 62 will be printed, e.g. by masking during diffusion/implantation/laser doping/deposition.

In the previous embodiments creation of the doped layer 40 of the second conductivity type opposite the first conductivity type in third step 23 preferably involves application of this layer 40 over the entire back surface. In alternative embodiment, the doped layer 40 may created in a patterned way, for example by applying a sacrificial mask in third step 23 before creation of the doped layer 40 of the second conductivity type, to prevent creation of the doped layer in an area of the back surface containing hole 32. In this case etching step 95 can be omitted for creating a cross-section similar to that of FIG. 10, but without a recess. Subsequently, the remaining part of the process of FIG. 9 may be used.

In an alternative embodiment of the process second area 62 is printed on a patterned isolating layer on the back surface. A trench is cut in a contour around the hole, or an area without the doped layer 40 of the second conductivity type is provided within the contour (e.g. by means of an etching step or patterned creation of the doped layer 40). The patterned isolating layer extends over the hole and beyond the contour on the back surface.

Figure 12:
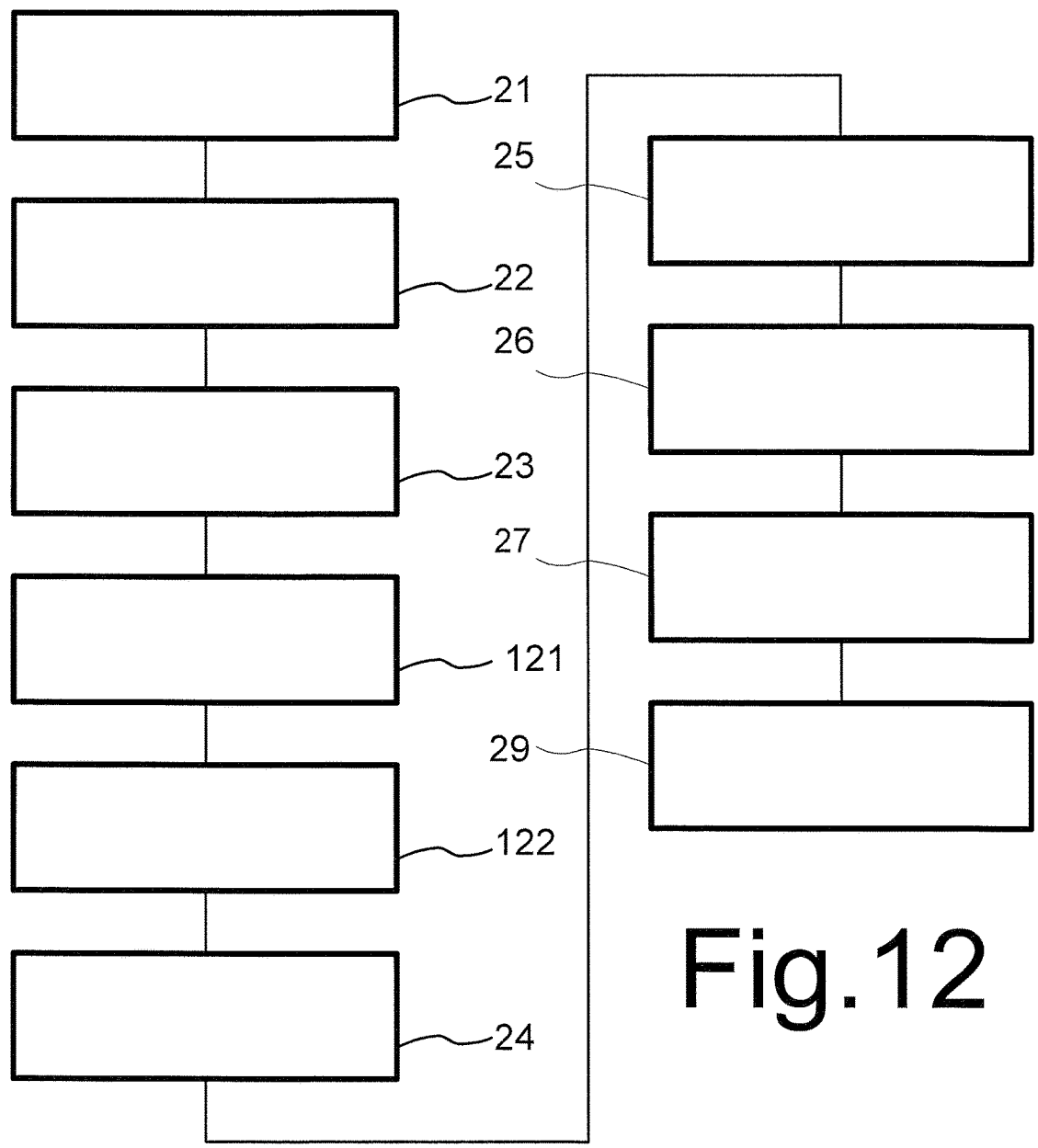
FIG. 12 shows a flow chart of an alternative embodiment
Figure 13:
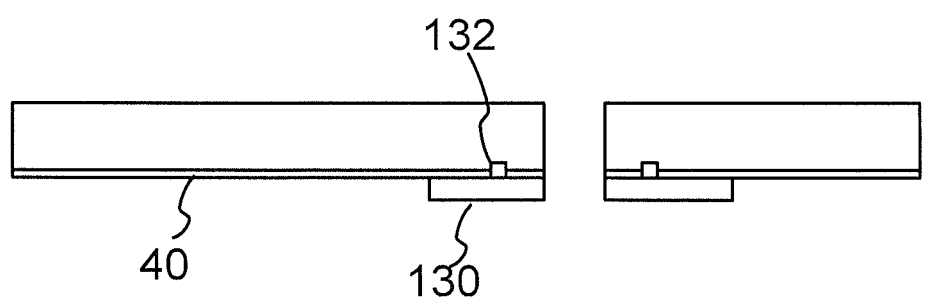
FIG. 13 shows a cell with isolation layer
Figure 14:
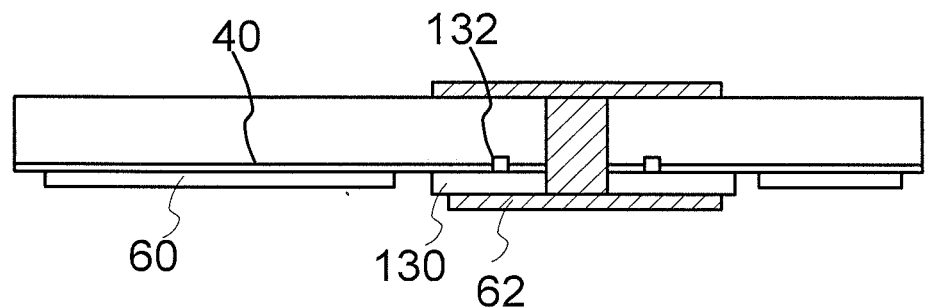
FIG. 14 shows a cell with a contact that extends beyond a trench

FIG. 12 shows a flow chart of this alternative embodiment of the process. After third step 23 (not necessarily immediately after third step 23) a first additional step 121 is performed wherein a trench is created in the contour around hole 32. Alternatively, doped layer 40 is removed from the entire area within the contour, or doped layer 40 is applied in a patterned way which avoids application in the area within the contour. Subsequently, an isolation layer creation step 122 may be performed wherein an isolation layer is created on the back surface at least in an area over hole 32 and extending beyond the contour. This may be done before fifth step 25, for example immediately after first additional step 121. A polyimide or silicon oxide isolation layer may be applied by printing for example, or a dielectric material such as silicon oxide or silicon nitride may be deposited. In an embodiment the isolation layer is applied in a patterned way, selectively in an area on the back surface that contains the entire contour along which the trench is cut or within which doped layer 40 is absent. In an embodiment the area in which the isolation layer is applied does not include the entire area within the contour. An inner area containing the location of hole 32 and a perimeter around hole 32 may be left uncovered by the isolation layer. This has the advantage that the risk of clogging the hole during printing is reduced, and that the risk of contamination during printing is reduced. FIG. 13 shows the cell with isolation layer 130 over trench 132. In this embodiment the process proceeds as described in the context of FIG. 9, except that the second area 62 in which conductor material is applied may extend beyond the contour, as long as it remains within the area where the isolation layer is applied. It suffices to provide isolation layer 130 on the back surface in a ring extending from trench 132 to the edge of second area 62, but it may extend further inward on the back surface towards hole 32. FIG. 14 shows the cell with an example of such a second area 62, which extends beyond trench 132, but not beyond the area in which isolation layer 130 is provided.

As may be noted, in this embodiment a patterned isolation layer 130 is used, that is absent in the first area 60, so that the conductor material in first area 60 is not electrically separated from the layer 40 of the opposite conductivity type. In an alternative embodiment an isolation layer may be used that extends also to first area 60. An isolation layer without patterning may be used for example, such as silicon nitride In this case a fire through step may be performed to connect the conductor material in the first area 60 to the back surface. Mutually different conductor materials may be applied in the first and second areas 60, 62 (e.g. a fire through conductor paste and a non-fire through conductor paste), to avoid that firing results in a connection through the isolation layer in the second area 62 outside the contour defined by trench 132.

In some cases it may not be necessary to use a trench through the emitter layer or provide for an area around hole 36 where no emitter layer is present, or the trench or area may reach through only part of the emitter layer. When a low conductivity emitter layer is used, short circuit current from the conductor material in the second area around the hole to the conductor material in the first area via the emitter layer may be negligible due to high lateral resistance and distance from most locations in the second area to the first area. This may be the case for example when a heterojunction is used, where the emitter layer is an amorphous semi-conductor layer such as an amorphous silicon layer with a thickness of less than a hundred nanometer (e.g. 10-30 nanometer thick). Also, the (amorphous) emitter layer may comprise an intrinsic sub-layer (substantially without net doping type), in which case it is not needed to provide a trench or fully emitter free area through the intrinsic sub-layer.

When a low conductivity emitter layer is used on the back surface, it may be desirable to add a more highly conductive layer on the emitter layer. In this case, preferably the more highly conductive layer is absent (selectively not deposited or selectively removed), or at least less present under the conductor material in the second area around the hole, or the part of this more highly conductive layer in the second area is cut off from a remainder of this more highly conductive layer in the first area by a trench.

The emitter and base contacts of a solar cell are preferably substantially electrically isolated, so that the solar cell should not suffer from having internal shunts, including shunt at power generating conditions, and leakage current under reverse bias conditions. A typical acceptable shunt value for a solar cell at maximum power point is about 10 Ohm for a cell of 239 cm2, that means about 2000 Ohm·cm2, although cells with shunt down to about 200 Ohm·cm2 may still be commercially acceptable. A typical maximum allowable level for reverse current in a solar cell is about 1 A for a cell of 239 cm2 at reverse bias of 10V, but the typical desired average level for reverse current in a solar cell is to not exceed 0.1 A or even lower, for cells of 239 cm2 at reverse bias of 10V. The acceptable level for reverse current in a solar cell depends on module manufacturing technology, and the trend is to reduce these levels.

In each of these embodiments the electrode material is applied in the second area on a supporting surface that is substantially electrically isolated, at least once manufacturing of the photovoltaic cell is complete, from current flowing laterally through the layer of the second conductivity type at positions corresponding to an edge of the first area.

In exemplary embodiments, the support surface may be the layer of the second conductivity type between the semi-conductor body and the electrode material in the second area. In one of these exemplary embodiments the layer of the second conductivity type may be a layer of amorphous semi-conductor material of the second conductivity type deposited on the semi-conductor body. This provides for small conductivity in the lateral direction that may provide sufficient isolation because of the lateral distance for most points in the second area to the first area. In another of these exemplary embodiments the method comprises removing material from the back surface at least partly through the layer of the second conductivity type on the back surface locally in a contour around the second area (preferably along the entire contour surrounding the second area, but it may be acceptable if a part of the contour has no such layer). In another exemplary embodiments, the method comprises preventing creation of the layer of the second conductivity type on the back surface locally in a contour around the second area. When the layer of the second conductivity type is entirely removed or prevented in the contour, i.e. when a trench through the layer of the second conductivity type around the second area is provided, this electrically isolates from lateral current from the layer of the second conductivity type adjacent the electrode material in the first area. But even if such a trench leaves a small fraction of the thickness of the layer of the second conductivity type, sufficient electrical isolation may be provided.

In alternative exemplary embodiments, the support layer is the semiconductor body or the layer of the second conductivity type adjacent the second area. In such exemplary embodiments the method may comprise at least partly removing the layer of the second conductivity type everywhere within a contour around the second area. Alternatively, the method may comprise at least partly preventing creation of the layer of the second conductivity type everywhere within a contour around the second area. When the layer of the second conductivity type is entirely removed or prevented within the contour, this electrically isolates from lateral current from the layer of the second conductivity type adjacent the electrode material in the first area. But even if the layer is only partly removed or prevented sufficient electrical isolation may be provided.

In alternative exemplary embodiments, the support layer that supports the conductor material in the second area is an additional isolation layer. In this case, the method comprises creating the additional isolation layer at least in a part of the second area that overlies a part of the layer of the second conductivity type that is in uninterrupted connection with a further part of the layer of the second conductivity type that lies between the first area 60 and the semi-conductor substrate, the electrode material in the second area being applied on the additional isolation layer. In a yet other exemplary embodiments the method comprises removing material from the back surface at least partly through the layer of the second conductivity type on the back surface locally in a contour around the hole before creating the additional isolation layer. This prevents current to the wall of the hole.

The invention claimed is:

1. A photovoltaic cell, comprising
   a semiconductor body of a first conductivity type having a front surface and a back surface, with at least one hole through the semiconductor body from the front surface to the back surface,
   a layer of a second conductivity type at least adjacent the back surface in or on the semiconductor body, the layer of the second conductivity type extending substantially over the whole back surface, wherein the second conductivity type is different than the first conductivity type;
   electrodes comprising electrode material in mutually separate first and second areas on the back surface, the layer of the second conductivity type extending entirely under the electrode material in the first area, the electrode material in the first area electrically contacting the layer of the second conductivity type outside said second area and within said first area, the second area covering the at least one hole on the back surface, the layer of the second conductivity type lying between the semiconductor body and the electrode material in the second area, the layer of the second conductivity type around the second area being at least partially interrupted;
   a layer with increased doping of the first conductivity type at least extending over the front surface in or on the semiconductor body;
   electrode material on the layer with increased doping in a further area on the front surface, the further area covering the at least one hole on the front surface, wherein the electrode material in the further area is in electrical contact with the electrode material of the second area on the back surface.

2. The photovoltaic cell according to claim 1, wherein the layer of the second conductivity type around the second area is at least partially interrupted by a trench.

3. The photovoltaic cell according to claim 2, wherein the trench runs in a closed contour around the second area.

4. The photovoltaic cell according to claim 1, wherein the electrode material is present in the second area on a supporting surface that is substantially electrically isolated, at least once manufacturing of the photovoltaic cell is complete, from current flowing laterally through the layer of the second conductivity type at positions corresponding to an edge of the first area.

5. A photovoltaic cell, comprising
   a semiconductor body of a first conductivity type having a front surface and a back surface, with at least one hole through the semiconductor body from the front surface to the back surface,
   a layer of a second conductivity type at least adjacent the back surface in or on the semiconductor body, the layer of the second conductivity type extending substantially over the whole back surface, wherein the second conductivity type is different than the first conductivity type;
   electrodes comprising electrode material in mutually separate first and second areas on the back surface, the layer of the second conductivity type extending entirely under the electrode material in the first area, the electrode material in the first area electrically contacting the layer of the second conductivity type outside said second area and within said first area, the second area covering the at least one hole on the back surface, the electrode material in the second area having a supported surface directly or indirectly supported on said layer of the second conductivity type, said supported surface being substantially isolated from current flowing laterally through said layer of the second conductivity type;

wherein the layer of the second conductivity type is between the semiconductor body and the electrode material in the second area;

a layer with increased doping of the first conductivity type at least extending over the front surface in or on the semiconductor body;

electrode material on the layer of increased doping in a further area on the front surface, the further area covering the at least one hole on the front surface, wherein the electrode material in the further area is in electrical contact with the electrode material of the second area on the back surface.

6. The photovoltaic cell according to claim 5, wherein the layer of the second conductivity type lies on the semiconductor body and forms a heterojunction with the semiconductor body.

7. The photovoltaic cell according to claim 6, wherein the supported surface of the electrode material in the second area is electrically isolated from the layer of the second conductivity type by an isolation layer between the supported surface and the layer of the second conductivity type.

8. The photovoltaic cell according to claim 5, wherein the layer of the second conductivity type comprises an intrinsic sub-layer, substantially without net doping.

9. A photovoltaic cell, comprising
a semiconductor body of a first conductivity type having a front surface and a back surface, with at least one hole through the semiconductor body from the front surface to the back surface,
a layer of a second conductivity type at least adjacent the back surface in or on the semiconductor body, the layer of the second conductivity type extending substantially over the whole back surface, wherein the second conductivity type is different than the first conductivity type;

electrodes comprising electrode material in mutually separate first and second areas on the back surface, the layer of the second conductivity type extending entirely under the electrode material in the first area, the electrode material in the first area electrically contacting the layer of the second conductivity type outside said second area and within said first area, the second area covering the at least one hole on the back surface, the electrode material in the second area being in direct contact with said layer of the second conductivity type, the layer of the second conductivity type around the second area being at least partially interrupted;

a layer with increased doping of the first conductivity type at least extending over the front surface in or on the semiconductor body;

electrode material on the layer of increased doping in a further area on the front surface, the further area covering the at least one hole on the front surface, wherein the electrode material in the further area is in electrical contact with the electrode material of the second area on the back surface.

10. The photovoltaic cell according to claim 9, wherein the layer of the second conductivity type is an amorphous semi-conductor layer.

11. The photovoltaic cell according to claim 10, wherein the amorphous semi-conductor layer has a thickness of less than a hundred nanometer.

12. The photovoltaic cell according to claim 10, wherein the amorphous semi-conductor layer has a thickness between 10 and 30 nanometer.

* * * * *